(12) United States Patent
Kinoshita et al.

(10) Patent No.: US 8,642,988 B2
(45) Date of Patent: Feb. 4, 2014

(54) NON-VOLATILE MEMORY DEVICE

(75) Inventors: Masaharu Kinoshita, Tsukuba (JP);
Yoshitaka Sasago, Tachikawa (JP);
Takashi Kobayashi, Higashimurayama (JP); Hiroyuki Minemura, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/588,112

(22) Filed: Aug. 17, 2012

(65) Prior Publication Data
US 2013/0075684 A1    Mar. 28, 2013

(30) Foreign Application Priority Data

Sep. 26, 2011    (JP) ................. 2011-209811

(51) Int. Cl.
*H01L 29/02*    (2006.01)
(52) U.S. Cl.
USPC ............ 257/2; 257/5; 257/296; 257/E45.002; 438/102; 438/103; 438/129; 438/381; 977/773
(58) Field of Classification Search
USPC ............ 257/2–5, 42, 296, E45.002, E27.004, 257/E29.002, 296.029; 438/102–103, 129, 438/238, 381, 482; 977/773
See application file for complete search history.

(56) References Cited

U.S. PATENT DOCUMENTS

2008/0149913 A1    6/2008   Tanaka et al.
2010/0182828 A1    7/2010   Shima et al.

FOREIGN PATENT DOCUMENTS

JP    2008-160004 A    7/2008
JP    2010-165982 A    7/2010

*Primary Examiner* — Mark A Laurenzi
(74) *Attorney, Agent, or Firm* — Miles & Stockbridge P.C.

(57) ABSTRACT

A non-volatile memory device includes: a first line extending along a main surface of a substrate; a stack provided above the first line; a second line formed above the stack; a select element provided where the first and second lines intersect, the select element adapted to pass current in a direction perpendicular to the main surface; a second insulator film provided along a side surface of the stack; a channel layer provided along the second insulator film; an adhesion layer provided along the channel layer; and a variable resistance material layer provided along the adhesion layer, wherein the first and second lines are electrically connected via the select element and channel layer, a contact resistance via the adhesion layer between the channel layer and variable resistance material layer is low, and a resistance of the adhesion layer is high with respect to an extending direction of the channel layer.

13 Claims, 17 Drawing Sheets

NON-VOLATILE MEMORY DEVICE

CLAIM OF PRIORITY

The present application claims priority from Japanese patent application JP 2011-209811 filed on Sep. 26, 2011, the content of which is hereby incorporated by reference into this application.

BACKGROUND

The present invention relates to a non-volatile memory device.

Due to their favorable mobility, shock resistance, etc., the demand for non-volatile memory devices has been growing rapidly in recent years as memory devices for such compact mobile information devices as mobile personal computers, digital still cameras, etc. In order for the market for such compact devices to grow, increasing the density of memory devices as well as reducing their costs become vital. Accordingly, various memory cell systems have been proposed to these ends.

Currently, the most popular memory cell system is the flash memory. However, the size reduction technology thereof is approaching its limit, and as a non-volatile memory device to take its place, resistive random-access memory, which is one of the memory cell systems mentioned above, is under development.

JP Patent Application Publication (Kokai) No. 2008-160004 A (Patent Document 1) discloses a resistive random-access memory device in which a plurality of memory cells are connected in series and perpendicularly to the main surface of a substrate. The memory cells are structured in such a manner that a transistor, which is a select element, and a phase-change film, which is a storage element, are connected in parallel, and a gate insulator film, a channel silicon film, a barrier film, and a phase-change film are buried in a hole that penetrates a structure in which gates and insulator films are alternately stacked.

SUMMARY

With the non-volatile memory device described in Patent Document 1 comprising memory cells in which a select transistor and a phase-change material are connected in parallel, information is stored by controlling the resistance of the phase-change material, which is a storage element. Further, stored information is read by turning the select transistor off, and identifying the resistance based on the current that flows through the phase-change material. More specifically, the detected resistance comprises the on-resistance of the select transistor of an unselected cell, the resistance between the phase-change material of a selected cell and the channel silicon of the selected cell, and the resistance of the phase-change material of the selected cell. However, the resistance between the phase-change material of the selected cell and the channel silicon of the selected cell is high, which poses a problem in that the read margin for information becomes narrow.

As such, an object of the present invention is to lower the resistance between the phase-change material of the selected cell and the channel silicon of the selected cell, thereby improving the reliability of the non-volatile memory device The above-mentioned object of the present invention and its novel features will become apparent from the following description and the accompanying drawings.

The present invention is characterized in that a non-volatile memory device that stores information through a change in resistivity is provided with an adhesion layer having the following properties, the adhesion layer being provided between a channel layer and a variable resistance material layer. The adhesion layer in this case has such properties that the contact resistance between the channel layer and the variable resistance material layer is low, while on the other hand the resistance is high in the direction in which the channel layer extends. These properties are realized by way of the composition and/or arrangement of the material forming the adhesion layer.

With the present invention, it is possible to improve the reliability of a non-volatile memory device. Other problems, features, and effects will become apparent from the following description of embodiments.

DETAILED DESCRIPTION

Figure 1:
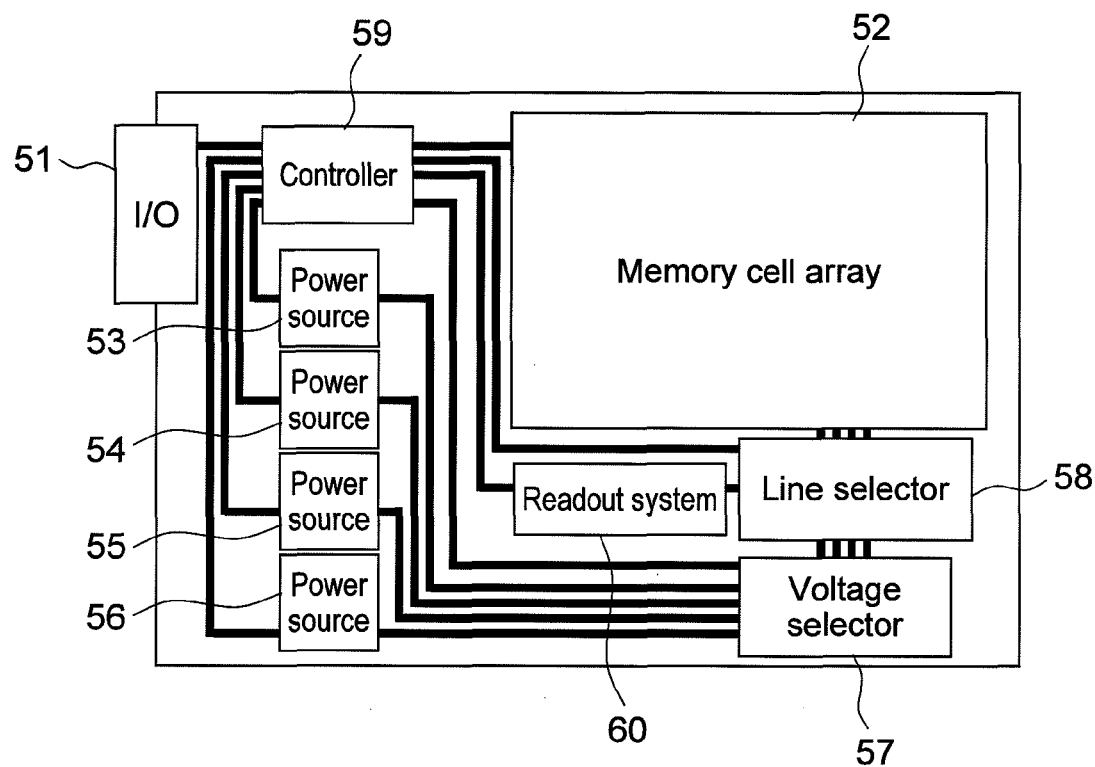
FIG. 1 is a plan view of a semiconductor chip comprising phase-change memory as an embodiment of the present invention.

Embodiments of the present invention are described in detail below based on the drawings. Throughout all of the drawings illustrating embodiments, members with like functions are designated with like reference numerals, while omitting descriptions thereof.

Further, with respect to the following embodiments, unless particularly necessary, descriptions of the same or like parts will generally not be repeated.

Further, in the drawings referenced in connection with the following embodiments, hatchings may in some cases be partially omitted for ease of viewing even for sectional views.

Further, in the drawings referenced in connection with the following embodiments, hatchings may in some cases be partially rendered for ease of viewing even for plan views and perspective views.

FIG. 1 is a plan view of a semiconductor chip, which shows in its entirety a non-volatile memory device according to the present embodiment. As shown in FIG. 1, a non-volatile memory device of the present embodiment comprises an I/O interface 51, a memory cell array 52, power sources 53-56, a voltage selector 57, a line selector 58, a controller 59, and a readout system 60.

The I/O interface 51 is a device comprising, for example, an input/output buffer for exchanging data with an external device. The memory cell array 52 comprises a storage element comprising the later-discussed phase-change memory. The voltage selector 57 comprises a device that selects a voltage from among the plurality of power sources 53-56 that are provided to supply a plurality of different voltages to the memory cell array 52. The line selector 58 comprises a device that selects the destination for the voltage outputted from the voltage selector 57 from among lines in the memory cell array 52 such as bit lines and word lines, etc. The readout system 60 comprising a sense amplifier, etc., is connected to the line selector 58. The controller 59 serves to control the device as a whole.

As shown in FIG. 1, the I/O interface 51 is connected to the controller 59. The controller 59 is connected to the I/O interface 51, the voltage selector 57, the line selector 58, the readout system 60, the memory cell array 52, and each of the power sources 53-56. Each of the power sources 53-56 is connected to the controller 59 and the voltage selector 57. The voltage selector 57 is connected to the controller 59, the power sources 53-56, and the line selector 58. The line selector 58 is connected to the voltage selector 57, the controller 59, the readout system 60, and the memory cell array 52. The readout system 60 is connected to the line selector 58 and the controller 59. The memory cell array 52 is connected to the line selector 58 and the controller 59.

If there is data input to the I/O interface 51 from a device (not shown) external to the non-volatile memory device, the controller 59 in FIG. 1 performs an operation whereby a voltage for writing data is selected by means of the voltage selector 57, a voltage pulse is generated using one of the power sources 53-56, and the voltage pulse is supplied to a predetermined line of the memory cell array 52 using the line selector 58. A phase-change memory cell within the memory cell array 52 is thus programmed with data.

As a data read signal is inputted to the I/O interface 51 from an external device, the controller 59 performs an operation whereby a voltage for reading data is selected by means of the voltage selector 57, a voltage is generated using one of the power sources 53-56, and the voltage is supplied to a predetermined line of the memory cell array 52 using the line selector 58. The current that is read as a result of supplying the voltage is read by the readout system 60, and this current is supplied to the external device via the controller 59 and the I/O interface 51 as information stored on the memory cell array 52.

Figure 2:
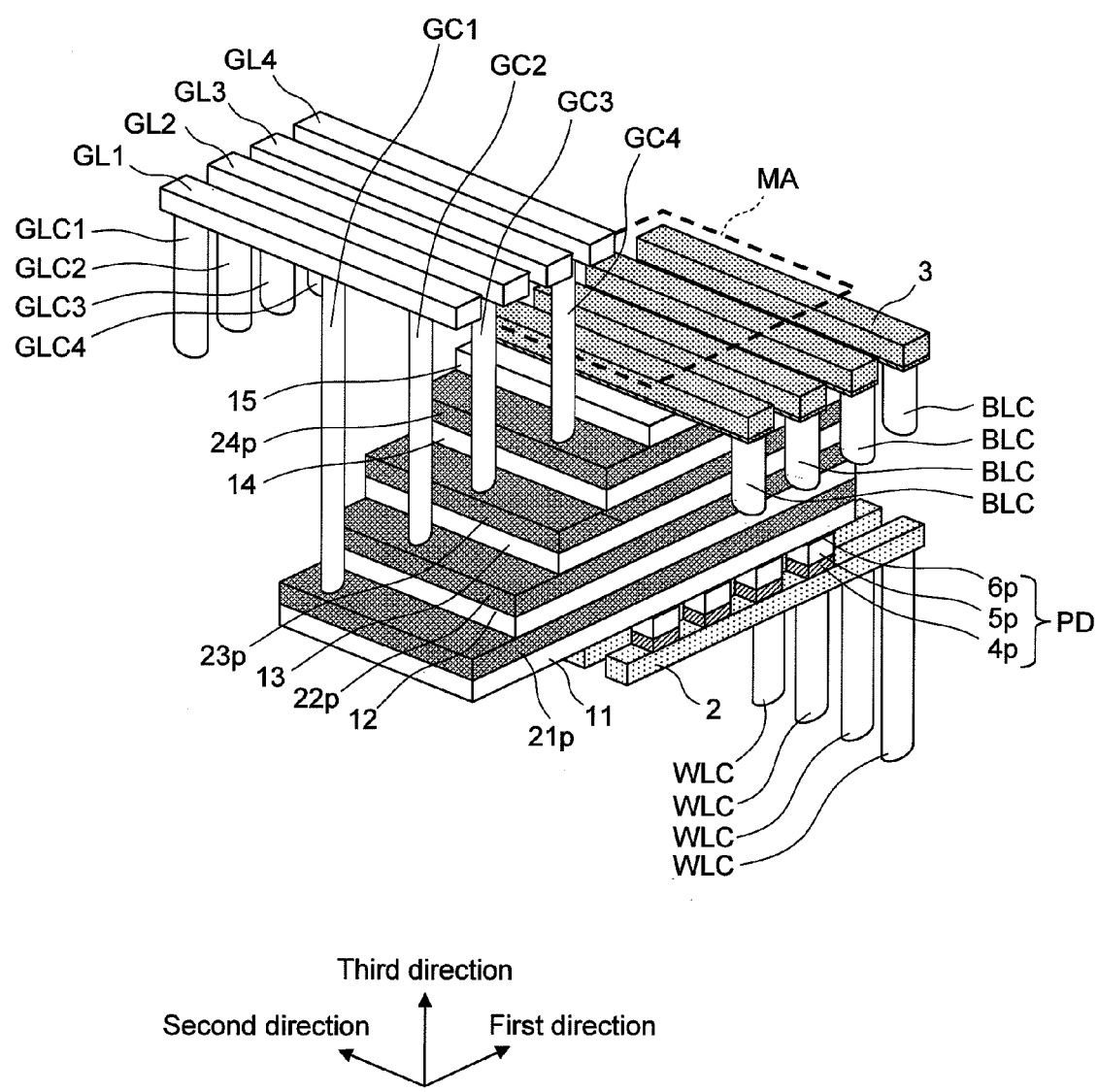
FIG. 2 is a perspective view of phase-change memory as an embodiment of the present invention.

FIG. 2 is a perspective view of phase-change memory of the present embodiment. There is partially shown a memory cell array MA, lines, and contact plugs. The phase-change memory shown in FIG. 2 shows a portion of memory devices provided within the memory cell array 52 shown in FIG. 1. In the region directly below the area enclosed by the broken lines shown in FIG. 2, the memory cell array MA comprising a plurality of memory cells (not shown) of phase-change memory is formed. Directly below the memory cell array MA are formed a semiconductor substrate (not shown), and a plurality of word lines 2 that comprise a metal wire and that extend in a first direction, which is parallel to the main surface of the semiconductor substrate. Below the plurality of word lines 2 lined up in a second direction, which is orthogonal to the first direction and parallel to the main surface of the semiconductor substrate, are respectively formed contact plugs WLC, which connect the respective word lines 2 with the line selector 58 (see FIG. 1).

Between the word lines 2 and the memory cell array MA, a plurality of polysilicon diodes PD are lined up at predetermined intervals in the first direction. The polysilicon diodes PD each comprise a pillar-like stack in which a polysilicon layer $4p$ doped with (into which is introduced) a p-type impurity (e.g., B (boron)), a polysilicon layer $5p$ containing almost no impurity at all, and a polysilicon layer $6p$ doped with an n-type impurity (e.g., P (phosphorus)) are stacked in the order above from the top surface side of the word lines 2. The memory cell array MA comprises an inter-layer insulator film 11, a gate polysilicon layer $21p$, an inter-layer insulator film 12, a gate polysilicon layer $22p$, an inter-layer insulator film 13, a gate polysilicon layer $23p$, an inter-layer insulator film 14, a gate polysilicon layer $24p$, and an inter-layer insulator film 15, which are stacked in the order above from the semiconductor substrate side. Above the memory cell array MA are formed gate signal lines GL1, GL2, GL3, and GL4. The gate polysilicon layer $21p$ and the gate signal line GL1 are connected via a contact plug GC1. The gate polysilicon layer $22p$ and the gate signal line GL2 are connected via a contact plug GC2. The gate polysilicon layer $23p$ and the gate signal line GL3 are connected via a contact plug GC3. The gate polysilicon layer $24p$ and the gate signal line GL4 are connected via a contact plug GC4.

To the gate signal lines GL1-GL4 are respectively connected contact plugs GLC1, GLC2, GLC3, and GLC4, which respectively connect the gate signal lines GL1-GL4 with the line selector 58 shown in FIG. 1. Above the memory cell array MA, a plurality of bit lines 3 are lined up in the first direction, the bit lines 3 each comprising a metal wire that extends in the second direction. Below the bit lines 3, a plurality of contact plugs BLC are respectively formed to connect the respective bit lines 3 with the line selector 58 shown in FIG. 1.

Figure 3:
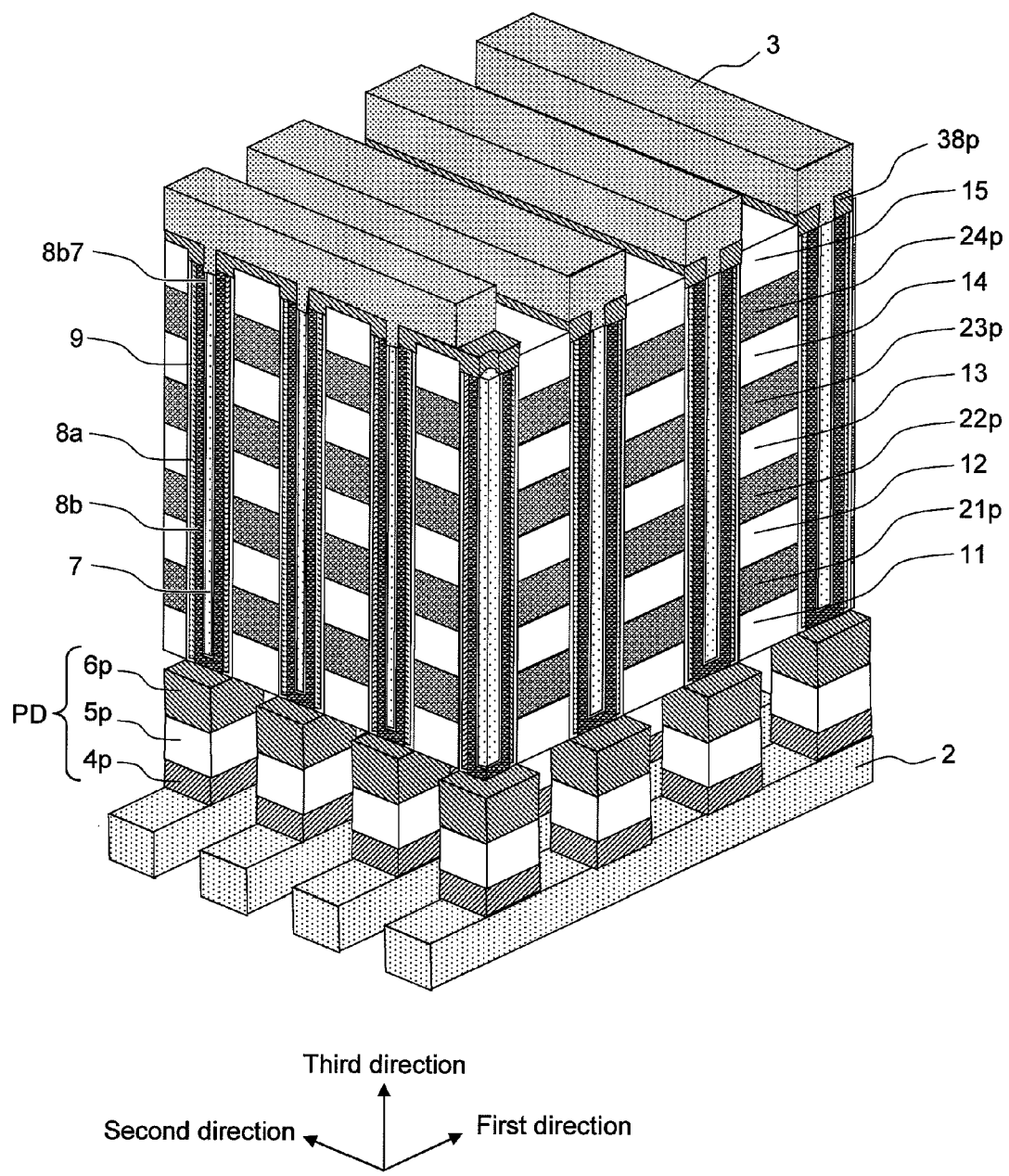
FIG. 3 is a perspective view showing a memory cell array of phase-change memory as an embodiment of the present invention.

FIG. 3 is a perspective view of phase-change memory, where, of the structure shown in FIG. 2, the portion of the memory cell array MA is shown removed from the rest. As shown in FIG. 3, a plurality of holes (connection holes) that penetrate from the upper surface of the inter-layer insulator film 15 to the lower surface of the inter-layer insulator film 11 are formed in the film stack comprising the inter-layer insulator film 11, the gate polysilicon layer $21p$, the inter-layer insulator film 12, the gate polysilicon layer $22p$, the inter-layer insulator film 13, the gate polysilicon layer $23p$, the inter-layer insulator film 14, the gate polysilicon layer $24p$, and the inter-layer insulator film 15, which are stacked in the order above from the main surface side of the semiconductor substrate (not shown). In other words, there is provided within the memory cell array MA a stack comprising N+1 layers (where N≥1) of inter-layer insulator films and N layers of semiconductor layers.

The connection holes are formed at positions where the plurality of word lines 2 and the plurality of bit lines 3 meet in plan view, and are arranged in a matrix-like fashion along the first direction and the second direction. In other words, the connection holes are formed between the word lines 2 and the bit lines 3 at regions where the word lines 2 and the bit lines 3 intersect in plan view (points of intersection).

Directly below each connection hole and directly above the word line 2 is formed the polysilicon diode PD, and the upper surface of the polysilicon diode PD is exposed at the bottom part of the connection hole. Within each connection hole are formed, in order from the inner wall side of each connection hole, a gate insulator film 9, a channel silicon film (channel layer) 8a, a channel silicon film (channel layer) 8b, an adhesion layer 8b7, and a phase-change material layer 7. The channel silicon films 8a and 8b are formed of an undoped polysilicon film into which no impurity has been introduced. At the bottom part of each connection hole, the gate insulator film 9 and the channel silicon film 8b are in contact with the upper surface of the polysilicon diode PD. A polysilicon layer 38p is formed between the channel silicon films 8a, 8b and each of the bit lines 3, thereby electrically connecting the channel silicon films 8a, 8b with the bit lines 3. The polysilicon layers 38p are conductive layers into which an impurity is introduced at a high concentration. In addition, the upper surfaces of the phase-change material layers 7 are in direct contact with the bit lines 3. In addition, although not shown in the drawing, an inter-layer insulator film 32 (see FIG. 4 and FIG. 5) is buried between neighboring polysilicon diodes PD.

Figure 4:
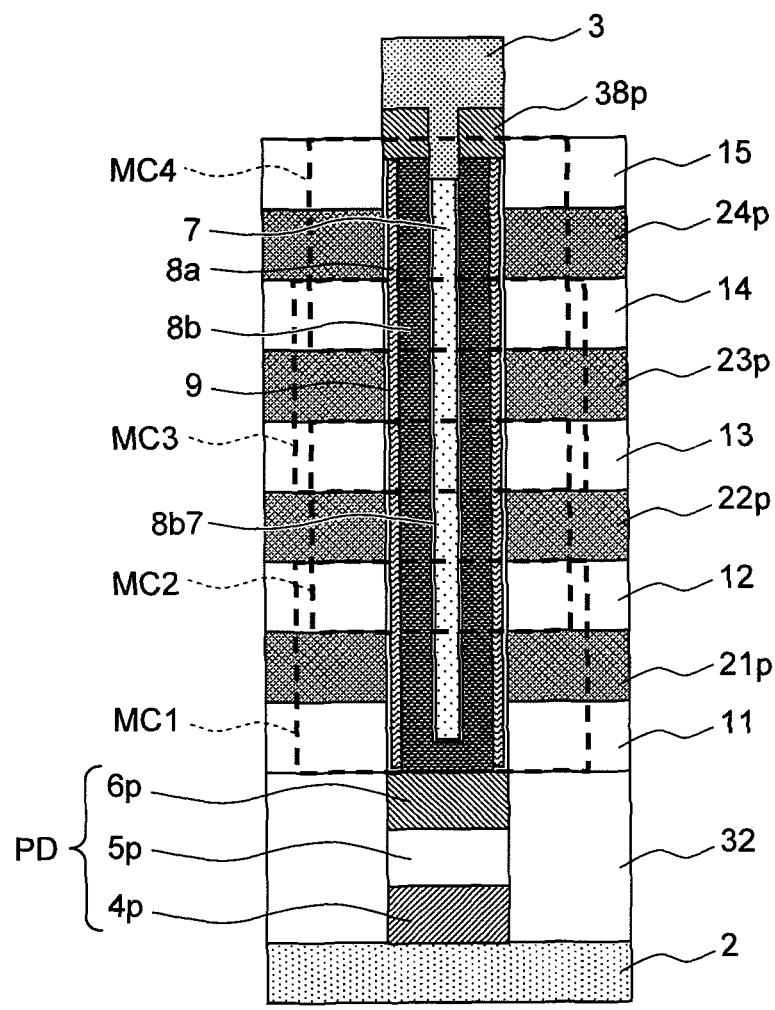
FIG. 4 is a sectional view of phase-change memory as an embodiment of the present invention.
Figure 5:
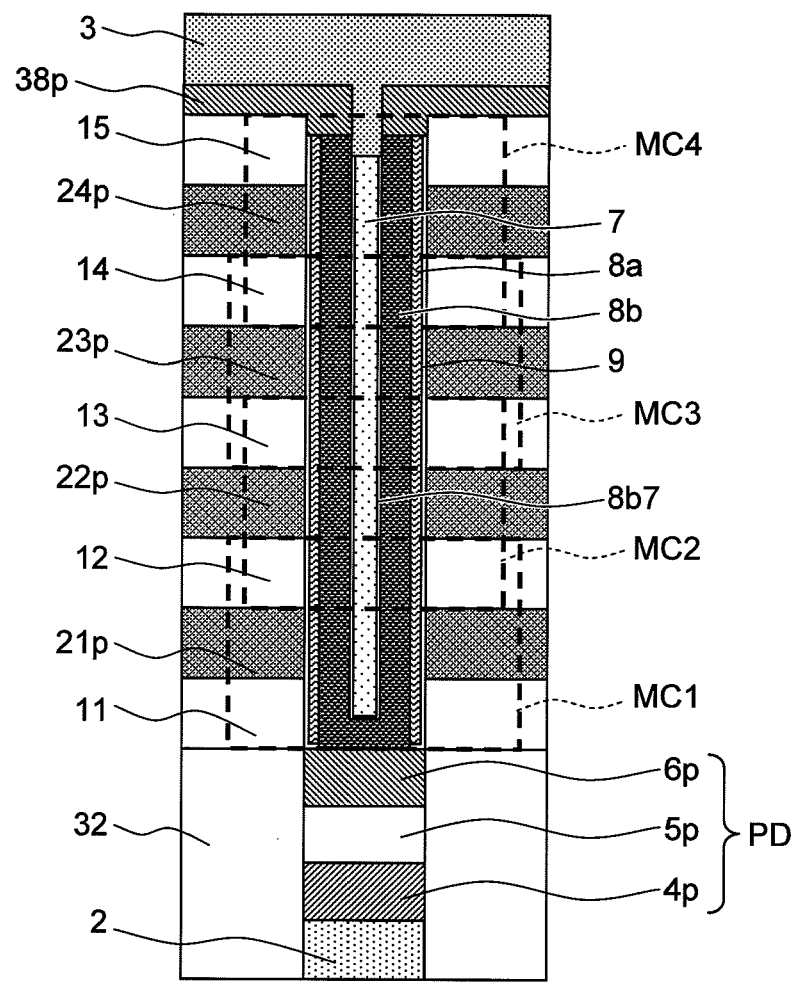
FIG. 5 is a sectional view of phase-change memory as an embodiment of the present invention.

FIG. 4 and FIG. 5 are sectional views of key parts of the memory cell array MA shown in FIG. 3. The section shown in FIG. 4 is a section taken along the direction in which the word lines 2 formed below the memory cell array MA, in FIG. 3 extend (first direction), and is a section that is perpendicular to the main surface of the semiconductor substrate (not shown). The section shown in FIG. 4 includes the word line 2. The section shown in FIG. 5 is a section taken along the direction in which the bit lines 3 formed above the memory cell array MA in FIG. 3 extend (second direction), and is a section that is perpendicular to the main surface of the semiconductor substrate (not shown). The section shown in FIG. 5 includes the bit line 3.

Phase-change memory is a storage element that uses a material whose resistivity can be varied via an electric current (e.g., a chalcogenide). In the present embodiment, there is used phase-change memory in which a phase-change material (chalcogenide), which is a storage element, and a select element (the polysilicon diode PD) are disposed between two metal electrodes of the word line and the bit line. The phase-change material layer 7 is disposed within each of the connection holes formed at the points of intersection between the word lines 2, which are select lines, and the bit lines 3. The polysilicon diodes PD are provided below the connection holes. The word lines 2 are electrically connected with the bit lines 3 via the polysilicon diodes PD and the channel silicon films 8a, 8b within the connection holes.

The resistivity of a chalcogenide, such as $Ge_2Sb_2Te_5$, etc., may be varied by causing the chalcogenide to change its state between an amorphous (non-crystalline) state and a crystalline state by means of the Joule heat generated when an electric current is applied. Chalcogenides have a high resistivity in an amorphous state, and a low resistivity in a crystalline state. These resistivities correspond to the information stored by the phase-change memory.

In order to reduce the contact resistance between the channel silicon film 8b and the phase-change material layer 7, the adhesion layer 8b7 comprising a thin metal is formed between the channel silicon film 8b and the phase-change material layer 7. The phase-change material layer 7 is thus provided along the side surface of the channel silicon film 8b with the adhesion layer 8b7 in-between. Here, the electrical property of the adhesion layer 8b7 is such that its resistance is low in the first and second directions, but high in the third direction (a direction perpendicular to the main surface of the semiconductor substrate (not shown)) orthogonal to the first and second directions. Here, the adhesion layer 8b7 is a compound comprising at least one of, for example, Ge, Sb, Te, Be, Se, Zr, and Si. In addition, the resistance of the adhesion layer 8b7 in the third direction is higher than the resistance of the phase-change material layer 7 in the third direction.

Figure 6:
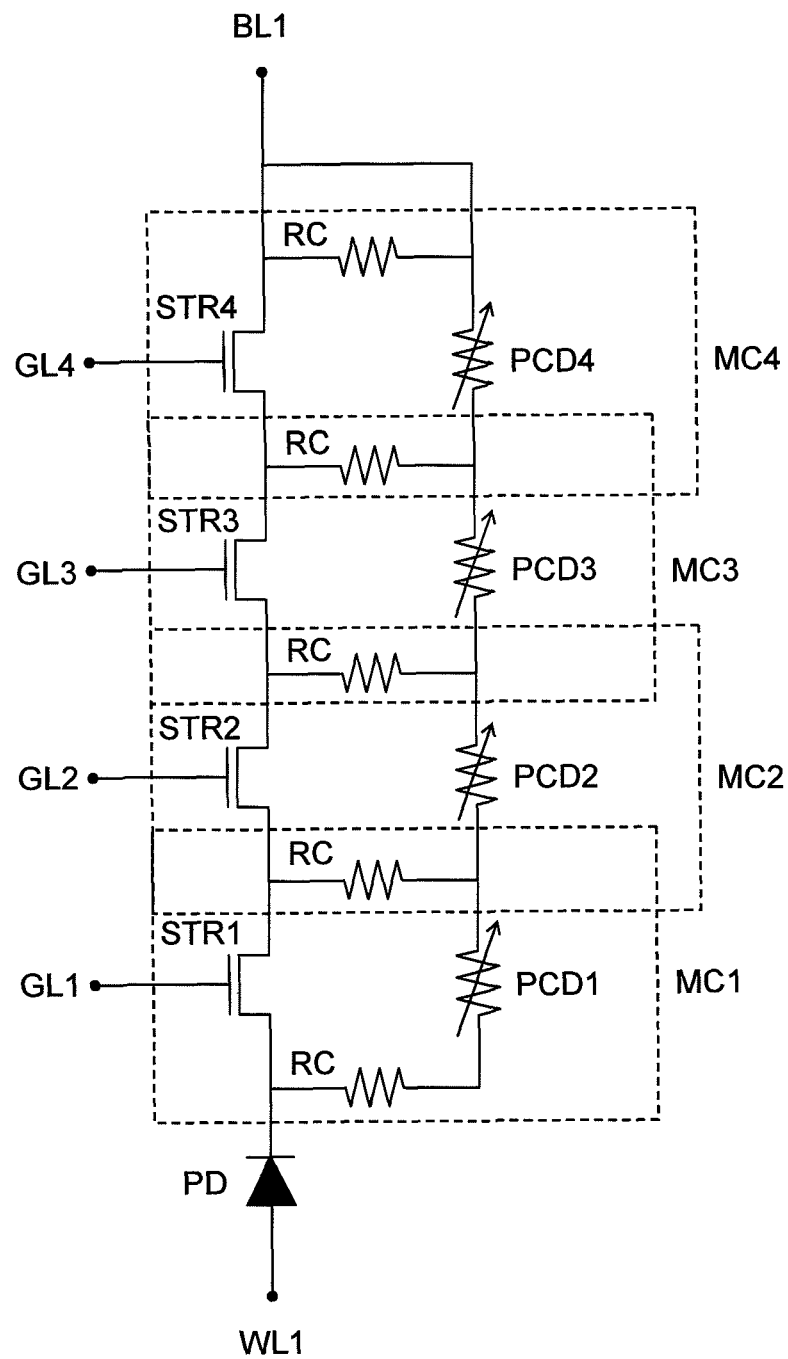
FIG. 6 is an equivalent circuit illustrating an operation of phase-change memory as an embodiment of the present invention.

FIG. 6 is an equivalent circuit corresponding to the phase-change memory shown in FIG. 4 and FIG. 5. As shown in FIG. 6, in order from the side of a word line WL1, the polysilicon diode PD, and memory cells MC1, MC2, MC3, and MC4 are connected in series between the word line WL1 and a bit line BL1. A structure in which a plurality of memory cells are thus consecutively connected in one direction will herein be referred to as a chain structure. As shown in FIG. 4 and FIG. 5, the gate polysilicon layers 21p-24p, which are gate electrodes of select transistors, the channel silicon films 8a, 8b, the adhesion layer 8b7, and the phase-change material layer 7 form the memory cells MC1-MC4 of the phase-change memory.

By way of example, the memory cell MC1 comprises the gate polysilicon layer 21p, and the channel silicon films 8a, 8b, adhesion layer 8b7, and phase-change material layer 7 formed within the connection hole that penetrates the insulator film 11, the gate polysilicon layer 21p, and the insulator film 12. Similarly, the memory cell MC2 comprises the gate polysilicon layer 22p, and the channel silicon films 8a, 8b, adhesion layer 8b7, and phase-change material layer 7 formed within the connection hole that penetrates the insulator film 12, the gate polysilicon layer 22p, and the insulator film 13. The memory cell MC3 comprises the gate polysilicon layer 23p, and the channel silicon films 8a, 8b, adhesion layer 8b7, and phase-change material layer 7 formed within the connection hole that penetrates the insulator film 13, the gate polysilicon layer 23p, and the insulator film 14. The memory cell MC4 comprises the gate polysilicon layer 24p, and the channel silicon films 8a, 8b, adhesion layer 8b7, and phase-change material layer 7 formed within the connection hole that penetrates the insulator film 14, the gate polysilicon layer 24p, and the insulator film 15. The regions enclosed by the broken lines in FIG. 4 and FIG. 5 respectively represent the memory cells MC1-MC4. The memory cells MC1-MC4 are so formed as to be vertically lined up within each connection hole above the polysilicon diode PD.

Memory cells are read in the following manner. By way of example, when reading information from the memory cell MC1 shown in FIG. 6, a voltage that places a select transistor STR1 in an off state is applied to the gate GL1, voltages that place the other select transistors STR2, STR3, and STR4 in an on state are applied to the gates GL2, GL3, and GL4, the bit line BL1 is grounded, and a read voltage is applied to the word line WL1.

Here, assuming that the parasitic resistance comprising the word line, the diode, the bit line, the channel silicon resistances of the unselected cells, and the peripheral circuit is Rp, that the contact resistance between the channel silicon and the phase-change material layer is Rc, that the resistance of the phase-change material layer in a crystalline state is RGST0, and that the resistance of the phase-change material layer in an amorphous state is RGST1, then read resistance R0 when the phase-change material layer of the selected cell is in a crystalline state would be R0=Rp+Rc+RGST0+Rc, and read resistance R1 when the phase-change material layer of the selected cell is in an amorphous state would be R1=Rp+Rc+RGST1+Rc. It is now assumed that RGST1 has a greater resistance value than RGST0, and that Rp is sufficiently smaller than Rc or RGST0. In this case, read resistance R0 becomes R0=2Rc+RGST0, and read resistance R1 may thus be deemed to be R0=2Rc+RGST1.

In the case of a memory cell of a structure where the channel silicon film and the phase-change material layer simply contact each other, contact resistance Rc may sometimes assume a large value. As contact resistance Rc consequently becomes greater than RGST1, and the resistance ratio between read resistance R0 and read resistance R1 becomes small, reliability drops. Accordingly, in the present embodiment, a reduction in contact resistance Rc is achieved by disposing the adhesion layer $8b7$ between the channel silicon film $8b$ and the phase-change material layer 7, thereby improving reliability.

Figure 7:
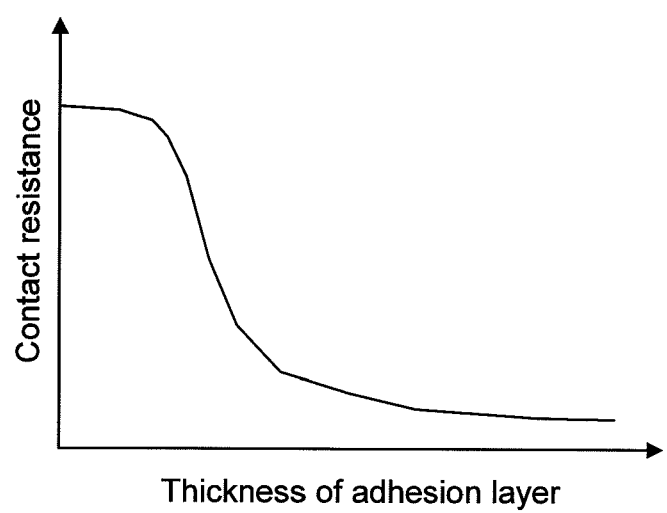
FIG. 7 is a graph illustrating the dependence of contact resistance on adhesion layer thickness.
Figure 8:
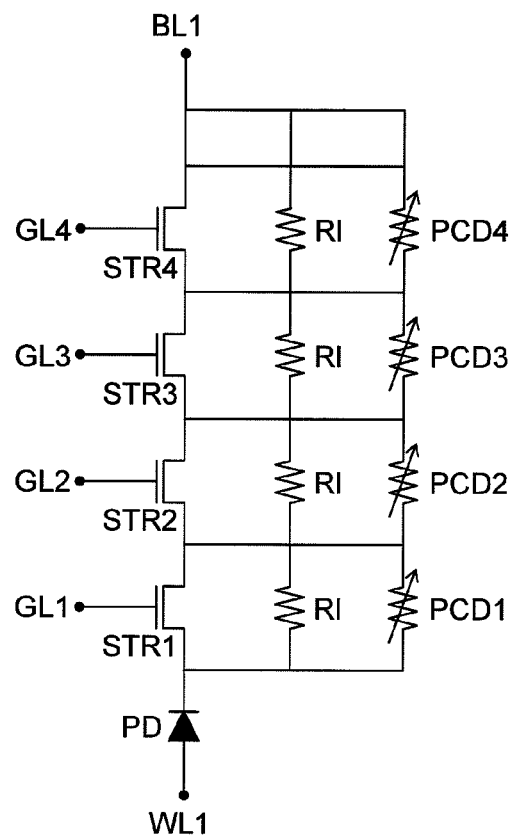
FIG. 8 is an equivalent circuit illustrating an operation of phase-change memory.

FIG. 7 is a graph representing the relationship between the thickness of the adhesion layer $8b7$ and contact resistance Rc. When the adhesion layer $8b7$ is thin, the contact resistance reduction effect is small, whereas when the adhesion layer $8b7$ is thick, the contact resistance reduction effect is significant. However, the thickness of the adhesion layer $8b7$ cannot simply be increased. An equivalent circuit for a case where the thickness of the adhesion layer $8b7$ has been increased is shown in FIG. 8. When the adhesion layer $8b7$ is too thick, resistances R1 of the adhesion layer $8b7$ in the third direction become a leak path as in the circuit diagram shown in FIG. 8, and the resistance ratio between read resistance R0 and read resistance R1 decreases. As a result, it becomes difficult to secure reliability.

Figure 9:
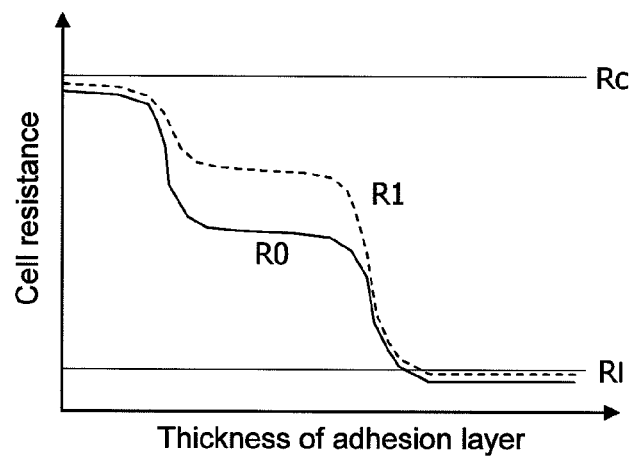
FIG. 9 is a graph illustrating the dependence of cell resistance on adhesion layer thickness.

Accordingly, it is preferable that the thickness of the adhesion layer $8b7$ be within a range that allows the resistance ratio to be maintained. FIG. 9 is a graph representing the relationship between the thickness of the adhesion layer $8b7$ and read resistances R0 and R1. The solid line in FIG. 9 represents a case where the phase-change material layer is in a crystalline state, and the broken line represents a case where the phase-change material layer is in an amorphous state. When the adhesion layer $8b7$ is too thin, read resistance R0 and read resistance R1 are almost equal to contact resistance Rc, and the read margin is small. In addition, when the adhesion layer $8b7$ is too thick, read resistance R0 and read resistance R1 become almost equal to resistance R1 of the adhesion layer $8b7$ in the third direction due to the leak at the adhesion layer $8b7$, and the read margin is small. Accordingly, it is preferable that the thickness of the adhesion layer be such that a read margin may be secured.

Memory cells are programmed/erased in the following manner. By way of example, when programming the memory cell MC1 shown in FIG. 6 with information, a voltage that places the select transistor STR1 in an off state is applied to the gate GL1, voltages that place the other select transistors STR2, STR3, and STR4 in an on state are applied to the gates GL2, GL3, and GL4, the bit line BL1 is grounded, and a programming/erasing voltage is applied to the word line WL1. The programming/erasing voltage is controlled in accordance with the information to be stored. In so doing, a current corresponding to the information to be stored flows through the phase-change material layer, and the programming/erasing of information in/from the memory cell is performed. In a reset (erase) operation, that is, in an operation for programming the information "1", a large current is passed through the phase-change material for a short period of time to melt the phase-change material, after which the current is rapidly decreased. When the phase-change material is rapidly cooled through such control, the phase-change material changes to an amorphous state with a high resistance. On the other hand, in a set (program) operation, that is, in an operation for programming the information "0", a current sufficient for maintaining the crystallization temperature of the phase-change material is passed for a long period of time, thereby changing the phase-change material to a crystalline state with a low resistance. In a read operation for phase-change memory, a given voltage difference is imparted across both ends of an element, and the current flowing through the element is measured, thereby determining the resistance state of the element.

With respect to phase-change memory that utilizes Joule heat generated by passing a current through a resistor, when the contact resistance is high, the center of heat generation shifts from the phase-change material layer to between the channel silicon film and the phase-change material layer. As a result, there arise the problem that the current required for programming/erasing increases, and the problem that the mis-programming of adjacent cells during programming/erasing becomes pronounced. Accordingly, it is preferable that the contact resistance be low not only for reading stored information but also for programming/erasing stored information.

Figure 10:
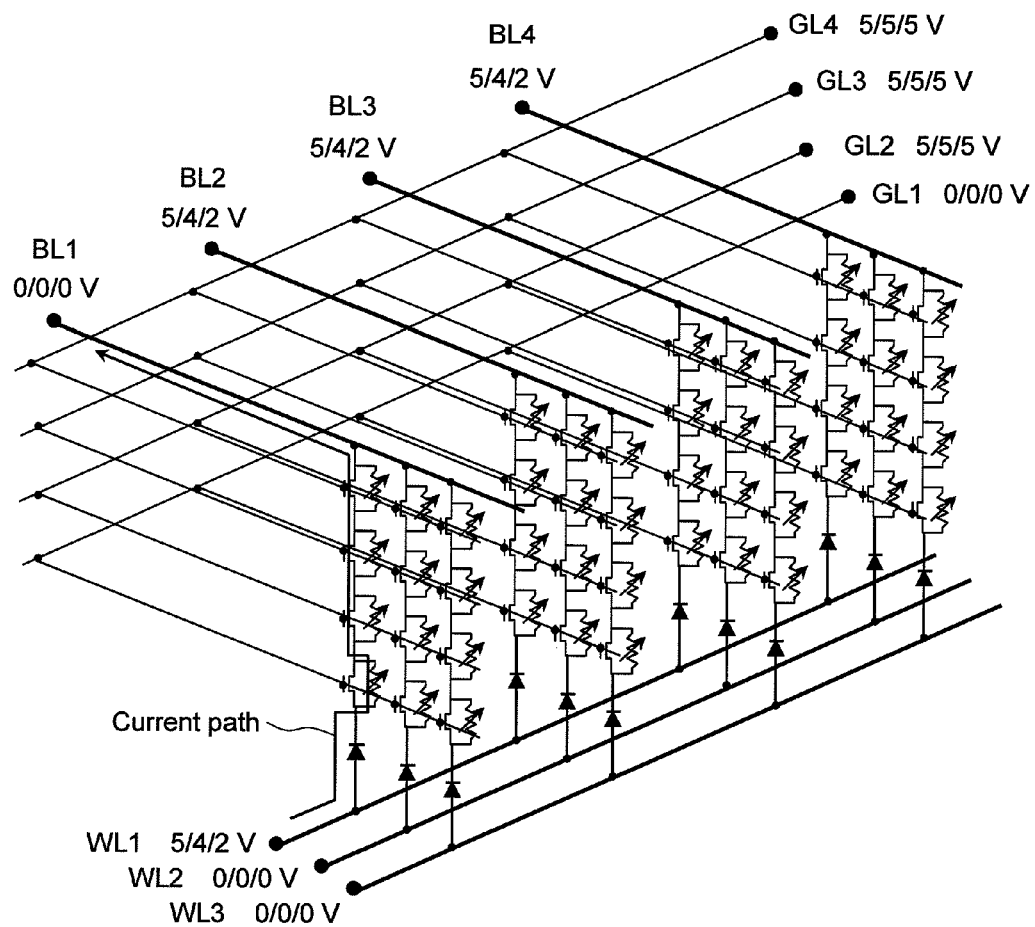
FIG. 10 is an equivalent circuit illustrating an operation of phase-change memory as an embodiment of the present invention.

Next, the operation of the phase-change memory within the plurality of connection holes disposed in a matrix-like fashion is described with reference to FIG. 10. FIG. 10 is an equivalent circuit illustrating the operation of the phase-change memory of the present embodiment. The memory cell array MA of the present embodiment (see FIG. 3) comprises a plurality of bit lines, a plurality of word lines, a plurality of polysilicon diodes, and a plurality of chain structures. Specifically, a plurality of word lines extending in the first direction are lined up in the second direction. A plurality of bit lines extending in the second direction are lined up in the first direction. A chain structure is provided at each of the positions where the bit lines and the word lines meet in plan view. Via each chain structure, the word line below the chain structure is electrically connected with the bit line above the chain structure. As in the circuit diagram shown in FIG. 6, each chain structure comprises the polysilicon diode PD that is connected in series between itself and the word line.

Operations for resetting, setting, and reading information (data) are carried out by, for example as shown in FIG. 10, controlling the voltages of the bit lines BL1, BL2, BL3, and BL4, the word lines WL1, WL2, and WL3, and the gate signal lines GL1, GL2, GL3, and GL4. As in the operation methods described in connection with FIG. 6, it is assumed that the voltages for the word line WL1 during a reset operation, a set operation, and a read operation are 5/4/2 V, respectively. The voltage notations for the other terminals in FIG. 10 likewise represent the voltages for, in order, a reset operation, set operation, and read operation. In other words, the three numbers separated with a "/" provided near the reference numerals/symbols shown in FIG. 10 represent, in order from the left, the voltages applied to the lines denoted by the respective reference numerals/symbols during operations for resetting, setting, and reading data. Specifically, in the operations shown in FIG. 10, during a reset operation, set operation, and read operation, 0/0/0 V are applied, respectively, to each of the gate signal line GL1, the bit line BL1, and the word lines WL2 and WL3. In addition, during a reset operation, set operation, and read operation, 5/5/5 V are applied to the gate signal lines GL2-GL4, and 5/4/2 V are applied to the bit lines BL2-BL4 and the word line WL1. In FIG. 10, the paths through which the current flows in these cases are indicated with arrows.

In the case of a chain structure that is connected to the bit line BL2, BL3, or BL4, and to the word line WL1, the voltages of the bit line and the word line are both 5 V during a reset operation, both 4 V during a set operation, and both 2 V during a read operation. Since there is no voltage difference, no current flows. In addition, in the case of a chain structure that is connected to the bit line BL1 and to the word line WL2 or WL3, the voltages of the bit line and the word line are both 0 V during a reset operation, set operation, and read operation. Since there is no voltage difference, no current flows. In addition, in the case of a chain structure connected to the bit line BL2, BL3, or BL4, and to the word line WL2 or WL3, 0 V and 5 V are applied to the word line and the bit line, respectively, during a reset operation, 0 V and 4 V are applied to the word line and the bit line, respectively, during a set operation, and 0 V and 2 V are applied to the word line and the bit line, respectively, during a read operation. However, since the polysilicon diode is reverse-biased, no current flows. Thus, the polysilicon diode becomes forward-biased, allowing a current to flow, only for the chain structure connected to the bit line BL1 and the word line WL1. The mechanism by which a given memory cell in the selected chain is selected is generally the same as the operation described with reference to FIG. 6. A given chain structure is thus selected from among the chain structures arranged in a matrix-like fashion, and a given memory cell within that given chain structure is further selected, thereby enabling a reset operation, set operation, or read operation to be performed.

Thus, according to the present embodiment, a highly reliable non-volatile memory device may be realized, the non-volatile memory device comprising: a stack in which semiconductor layers, which serve as gates, and insulator layers are alternately stacked on a substrate comprising a peripheral circuit; and a gate insulator film layer, a channel layer, an adhesion layer, and a variable resistance material layer formed on the inner wall of a connection hole penetrating the stack, wherein, by virtue of the adhesion layer disposed between the channel layer and the variable resistance material layer, it is made possible to reduce the contact resistance between the channel layer and the variable resistance material layer.

Figure 11:
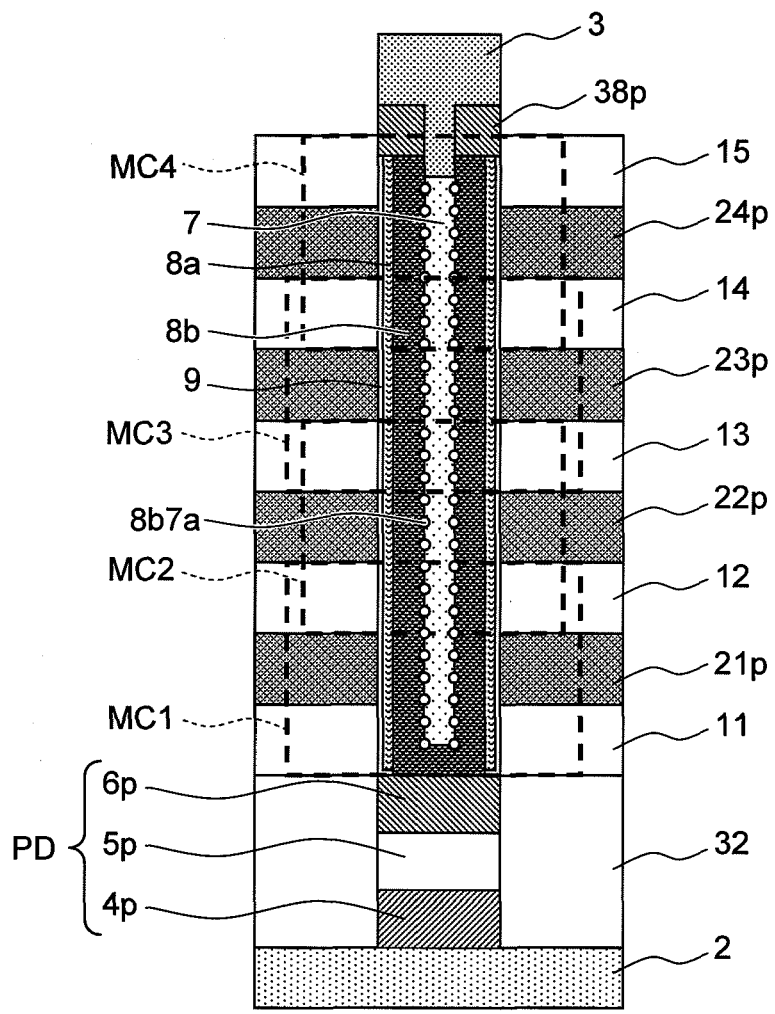
FIG. 11 is a sectional view of phase-change memory as an embodiment of the present invention.
Figure 11:
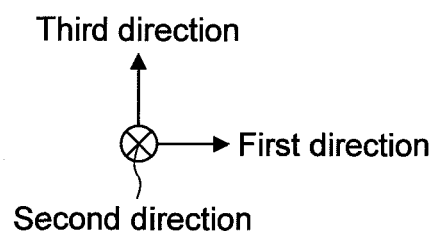
Figure 12:
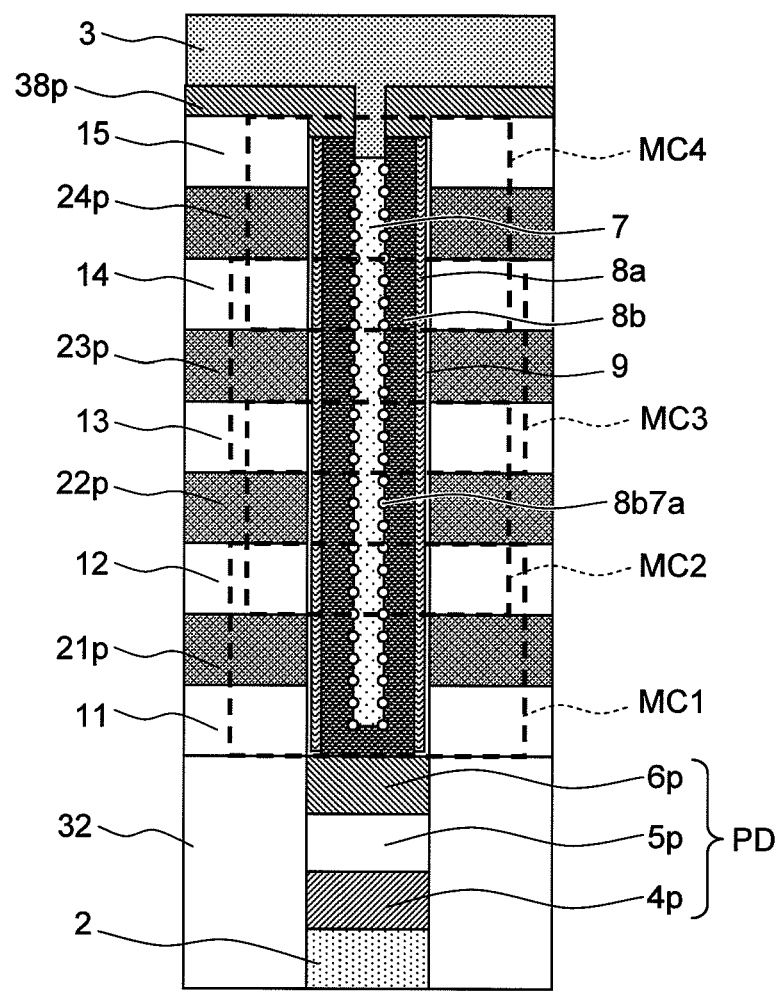
FIG. 12 is a sectional view of phase-change memory as an embodiment of the present invention.
Figure 12:
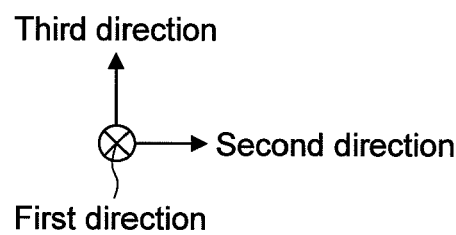

Further, as another embodiment, as shown in FIG. 11 and FIG. 12, an adhesion layer 8b7a may be, for example, a film that is discontinuous in the third direction. In other words, the adhesion layer 8b7a may be a film that is electrically insulated in the third direction. In FIG. 11 and FIG. 12, in order to emphasize the fact that the adhesion layer 8b7a is discontinuous in the third direction, the adhesion layer 8b7a is represented by circles, but this representation is adopted only for illustration purposes with respect to the present specification. Further, although, for purposes of representation, the circles representing the adhesion layer 8b7a may appear to be arranged at regular intervals along the third direction, it is not necessarily intended that it be limited to an equidistant arrangement. Rather, it need only be a film that is at least electrically insulated in the third direction. The adhesion layer 8b7a comprises, by way of example, a conductor such as a metal, a metal nitride, a metal oxide, a metal oxynitride, or a silicide. By way of example, if the adhesion layer 8b7a comprises a metal, the material of the adhesion layer 8b7a comprises a metal such as Ti, W, Mo, Al, Cu, etc., or a compound thereof. By way of example, if the adhesion layer 8b7a comprises a metal nitride, the material of the adhesion layer 8b7a comprises a nitride of Ti, W, Mo, Al, Cu, etc., or a compound thereof. By way of example, if the adhesion layer 8b7a comprises a metal oxide, the material of the adhesion layer 8b7a comprises an oxide of Ti, W, Mo, Al, Cu, etc., or a compound thereof. By way of example, if the adhesion layer 8b7a comprises a metal oxynitride, the material of the adhesion layer 8b7a comprises an oxynitride of Ti, W, Mo, Al, Cu, etc., or a compound thereof. By way of example, if the adhesion layer 8b7a comprises a silicide, the material of the adhesion layer 8b7a comprises Ti—Si, Co—Si, Ni—Si, etc. By disposing the adhesion layer 8b7a as islands of a metal that are discontinuous in the third direction as in the present embodiment, the contact area may be increased, and the contact resistance decreased. In addition, by having it be a discontinuous film, since there will no longer be any off-leak at the adhesion layer 8b7a, reliability may be improved.

Further, as another embodiment, the adhesion layer 8b7a shown in FIG. 11 and FIG. 12 may also be, by way of example, a semiconductor such as Si, GaAs, SiC, etc., or a compound thereof. By disposing the adhesion layer 8b7a as islands of a semiconductor that are discontinuous in the third direction, the contact area may be increased, and the contact resistance decreased. In addition, as compared to the embodiment where the adhesion layer 8b7a is a metal layer, since there is no diffusion of a metal species to the channel film of the select element, the off-leak at the channel film is reduced, enabling an improvement in reliability. More preferably, the adhesion layer 8b7a comprises Si doped with an impurity, e.g., phosphorus, etc. By doping with an impurity, a contact part with a high carrier concentration is formed, enabling a further reduction in contact resistance. In addition, when Si doped with an impurity is used, as compared to the embodiment where the adhesion layer 8b7a is a metal layer, since there is no diffusion of a metal species to the channel film of the select element, off-leak is reduced, enabling an improvement in reliability.

Figure 13:
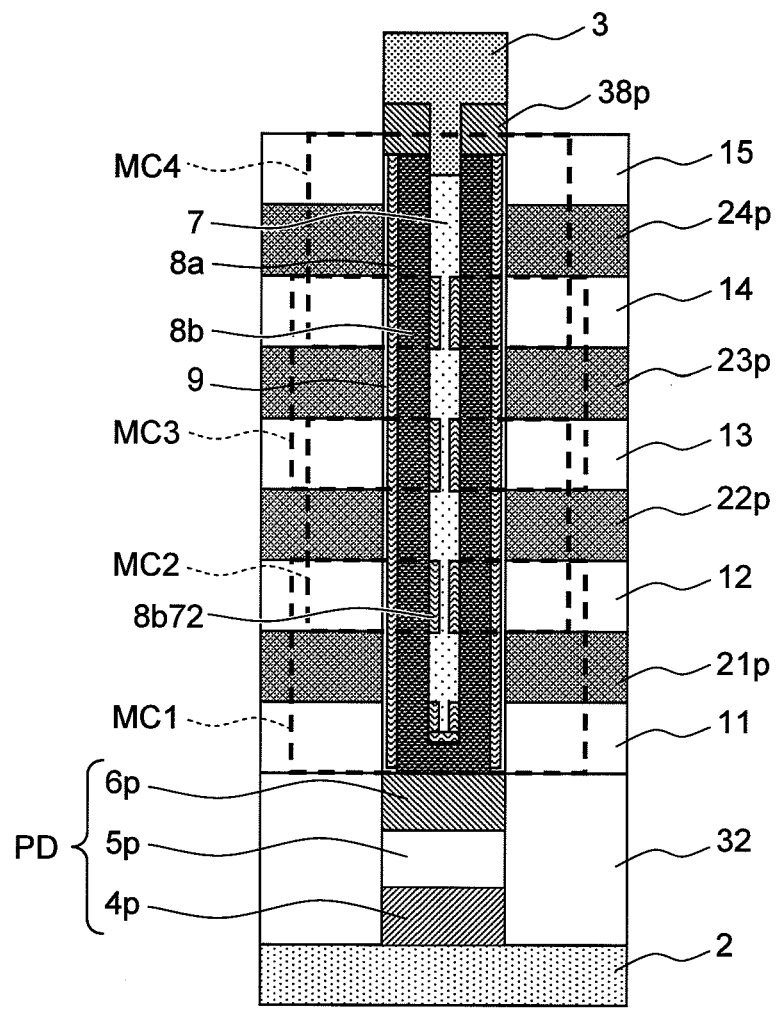
FIG. 13 is a sectional view of phase-change memory as an embodiment of the present invention.
Figure 13:
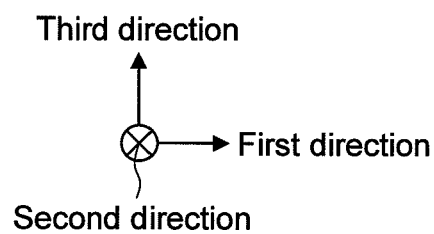
Figure 14:
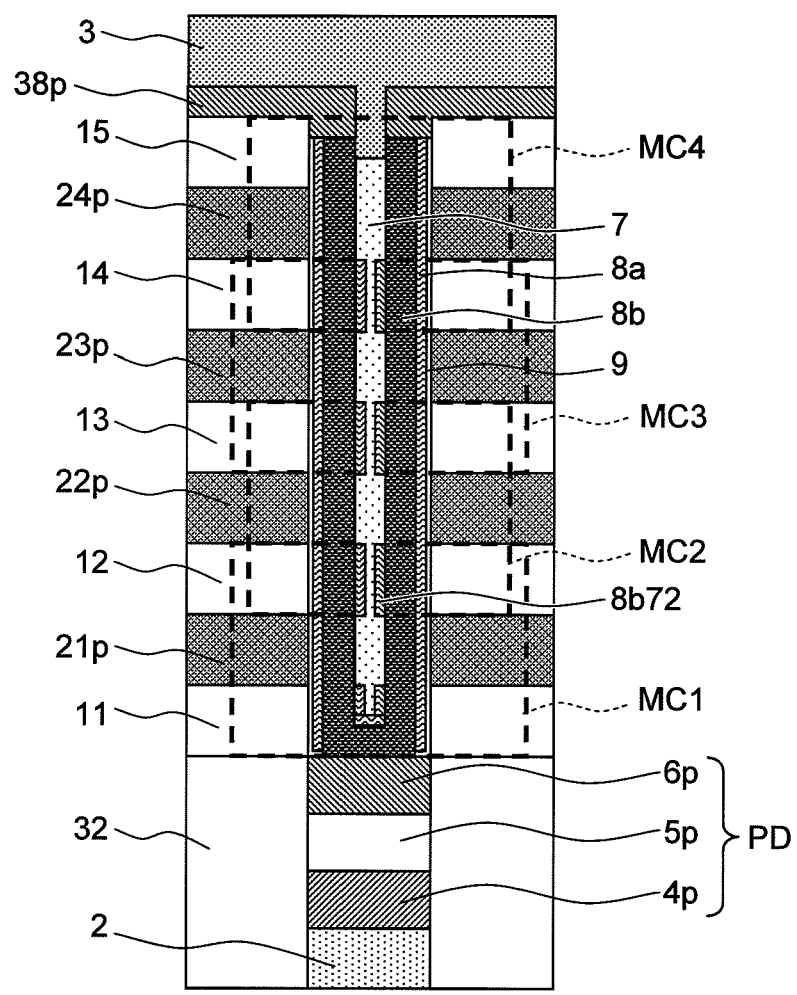
FIG. 14 is a sectional view of phase-change memory as an embodiment of the present invention.
Figure 14:
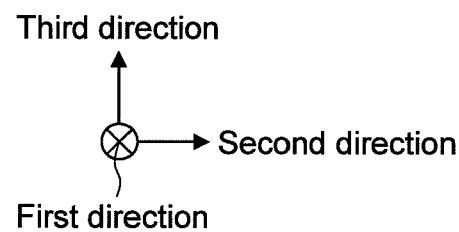

Further, as another embodiment, the sectional views shown in FIGS. 13 and 14 of a key part of a memory cell array are conceivable. In the present embodiment, an adhesion layer 8b72 comprises, by way of example, a film between the gate polysilicon layer 21p and the gate polysilicon layer 22p that is continuous in the third direction, where the adhesion layer 8b72 between the gate polysilicon layer 21p and the gate polysilicon layer 22p is discontinuous with the adhesion layer 8b72 between the gate polysilicon layer 22p and the gate polysilicon layer 23p. In other words, the adhesion layer 8b72 is disposed between the channel layer 8b and the phase-change material layer 7 only at heights corresponding to the inter-layer insulator films 11, 12, 13, and 14. By thus partially disposing the adhesion layer 8b72, it is possible to achieve a lower contact resistance as compared to the embodiment where a discontinuous adhesion layer is used. Here, the adhesion layer 8b72 comprises, by way of example, a conductor such as a metal, a metal nitride, a metal oxide, a metal oxynitride, or a silicide. By way of example, if the adhesion layer 8b72 comprises a metal, the material of the adhesion layer 8b72 comprises a metal such as Ti, W, Mo, Al, Cu, etc., or a compound thereof. By way of example, if the adhesion layer 8b72 comprises a metal nitride, the material of the adhesion layer 8b72 comprises a nitride of Ti, W, Mo, Al, Cu, etc., or a compound thereof. By way of example, if the adhesion layer 8b72 comprises a metal oxide, the material of the adhesion layer 8b72 comprises an oxide of Ti, W, Mo, Al, Cu, etc., or a compound thereof. By way of example, if the adhesion layer 8b72 comprises a metal oxynitride, the material of the adhesion layer 8b72 comprises an oxynitride of Ti, W, Mo, Al, Cu, etc., or a compound thereof. By way of example, if the adhesion layer 8b72 comprises a silicide, the material of the adhesion layer 8b72 comprises Ti—Si, Co—Si, Ni—Si, etc.

Figure 15:
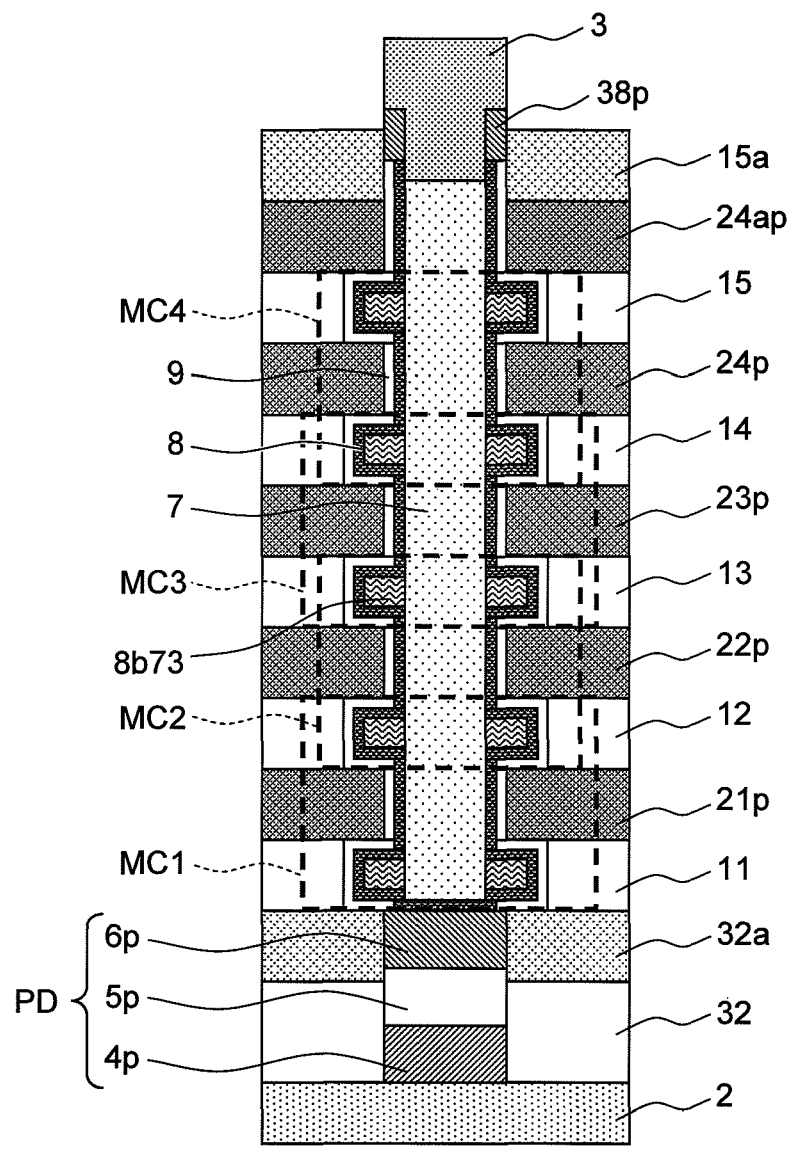
FIG. 15 is a sectional view of phase-change memory as an embodiment of the present invention.
Figure 15:
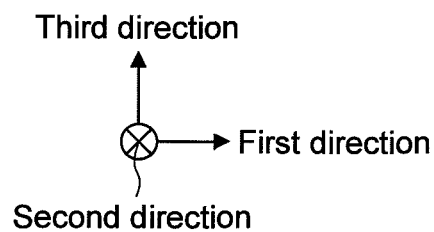
Figure 16:
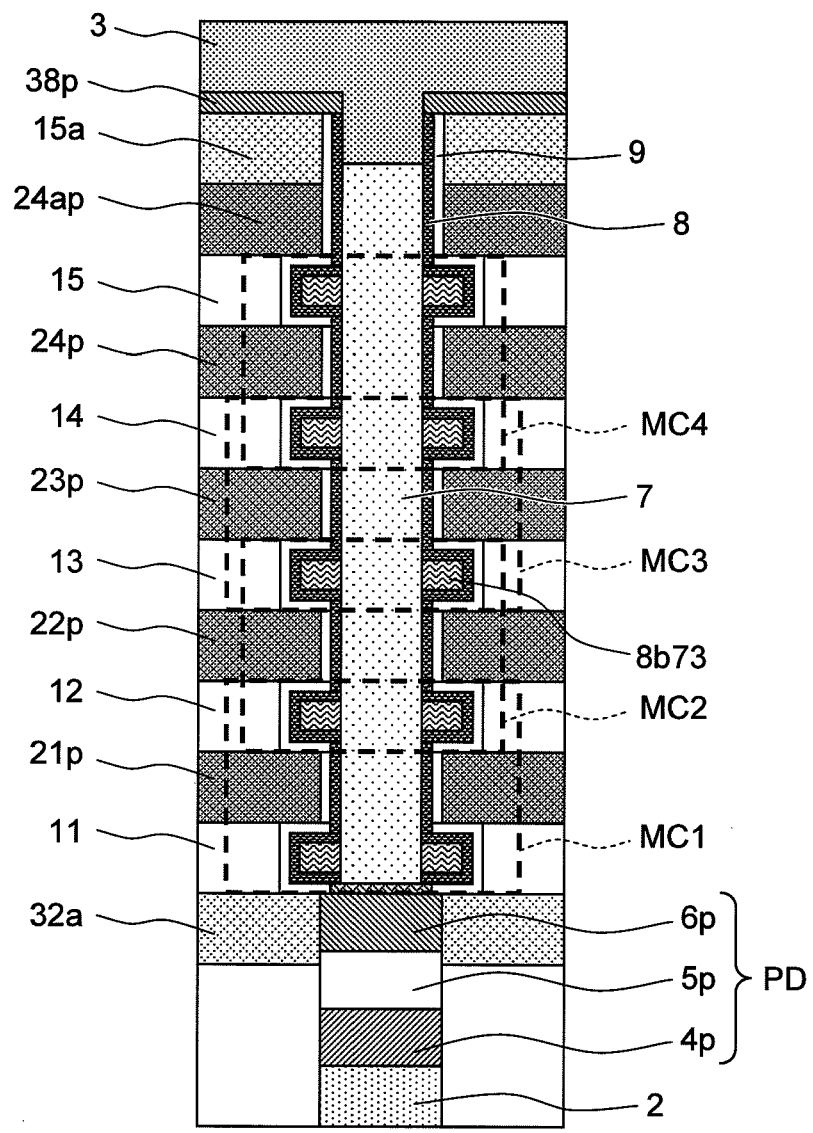
FIG. 16 is a sectional view of phase-change memory as an embodiment of the present invention.
Figure 16:
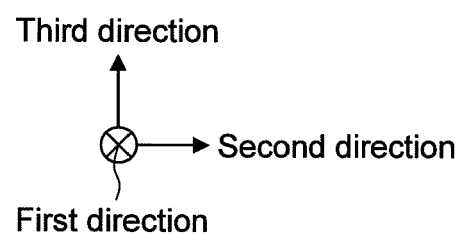

Further, as another embodiment, the sectional views shown in FIGS. 15 and 16 of a key part of a memory cell array are conceivable. In the present embodiment, an adhesion layer 8b73 comprises, by way of example, a film between the gate polysilicon layer 21p and the gate polysilicon layer 22p that is continuous in the third direction, where the adhesion layer 8b73 between the gate polysilicon layer 21p and the gate polysilicon layer 22p is separated from the adhesion layer 8b73 between the gate polysilicon layer 22p and the gate polysilicon layer 23p. In other words, in the present embodiment, the adhesion layer 8b73 is disposed in recessed parts formed in the inner wall of the connection hole (recessed parts that are one level lower and that are formed by having the side surface positions of the inter-layer insulator films 11, 12, 13, 14, and 15 be recessed relative to the side surface positions of the gate polysilicon layers 21p, 22p, 23p, 24p, and 24ap in the horizontal direction with respect to a plane comprising the first and second directions). It is noted that the adhesion layer 8b73 is disposed between the channel layer 8 and the phase-change material layer 7 at each of the height positions of the gate polysilicon layers 21p, 22p, 23p, 24p, and 24ap. By thus disposing the adhesion layer 8b73 in a discontinuous and partial manner with respect to the third direction, it is possible to reduce contact resistance. Here, the adhesion layer 8b73 comprises, by way of example, a conductor such as a metal, a metal nitride, a metal oxide, a metal oxynitride, or a silicide. By way of example, if the adhesion layer 8b73 comprises a metal, the material of the adhesion layer 8b73 comprises a metal such as Ti, W, Mo, Al, Cu, etc., or a compound thereof. By way of example, if the adhesion layer 8b73 comprises a metal nitride, the material of the adhesion layer 8b73 comprises a nitride of Ti, W, Mo, Al, Cu, etc., or a compound thereof. By way of example, if the adhesion layer 8b73 comprises a metal oxide, the material of the adhesion layer 8b73 comprises an oxide of Ti, W, Mo, Al, Cu, etc., or a compound thereof. By way of example, if the adhesion layer 8b73 comprises a metal oxynitride, the material of the adhesion layer 8b73 comprises an oxynitride of Ti, W, Mo, Al, Cu, etc., or a compound thereof. By way of example, if the adhesion layer 8b73 comprises a silicide, the material of the adhesion layer 8b73 comprises Ti—Si, Co—Si, Ni—Si, etc. It is noted that, in the present embodiment, the inter-layer insulator films 11, 12, 13, 14, and 15 differ from inter-layer insulator films 32a and 15a in material. By way of example, for the inter-layer insulator films 11, 12, 13, 14, and 15, a material with a faster etching rate than that of the material of the inter-layer insulator films 32a and 15a is used. By way of example, it is assumed that the inter-layer insulator films 11, 12, 13, 14, and 15 mainly comprise silicon oxide, and that the inter-layer insulator films 32a and 15a mainly comprise silicon nitride. By thus selecting the etching rates of the respective inter-layer insulator films, as shown in FIG. 15 and FIG. 16, it is possible to form a structure in which the side surfaces of the inter-layer insulator films 11, 12, 13, 14, and 15 are recessed relative to the side surfaces of the gate polysilicon layers 21p, 22p, 23p, 24p, and 24ap, while at the same time maintaining the shapes of the inter-layer insulator films 32a and 15a. In addition, in the present embodiment, the adhesion layer 8b73 may be formed through CVD techniques and dry etching techniques. Thus, with the present embodiment, it is possible to realize a highly reliably non-volatile memory device with smaller variations in property caused by manufacturing variations as compared to the embodiment described in connection with FIGS. 13 and 14.

Figure 17:
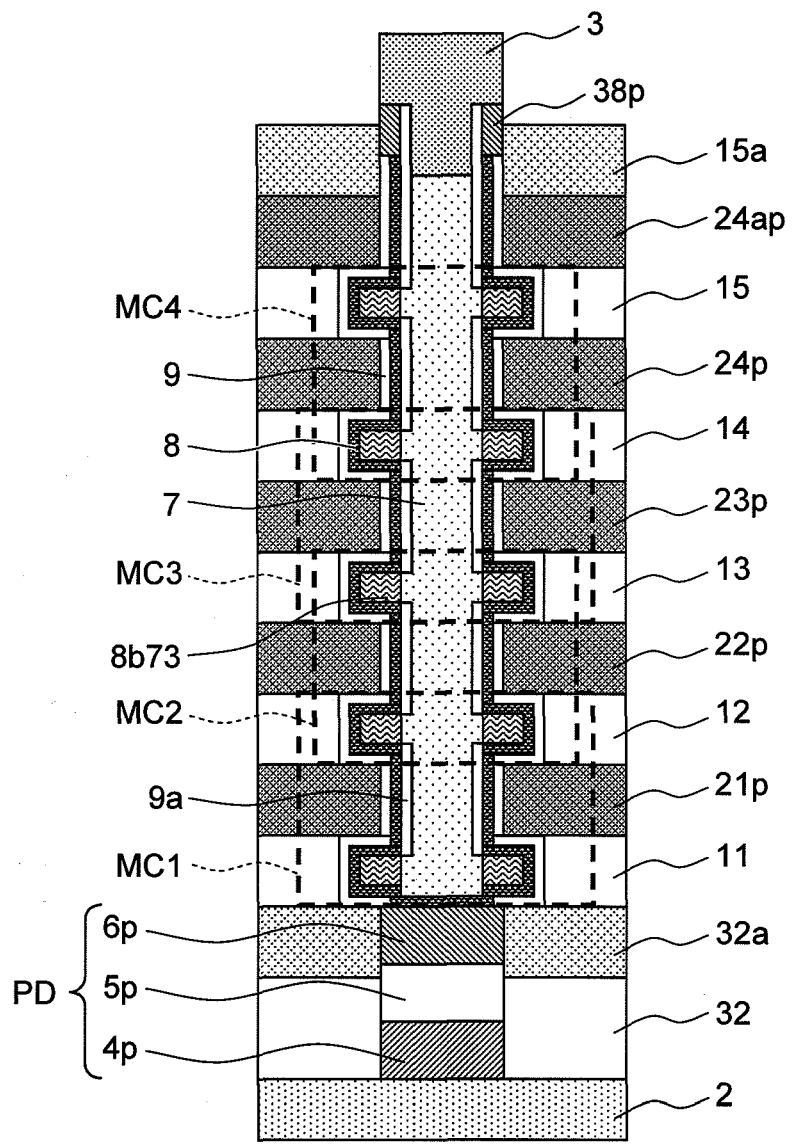
FIG. 17 is a sectional view of phase-change memory as an embodiment of the present invention.
Figure 18:
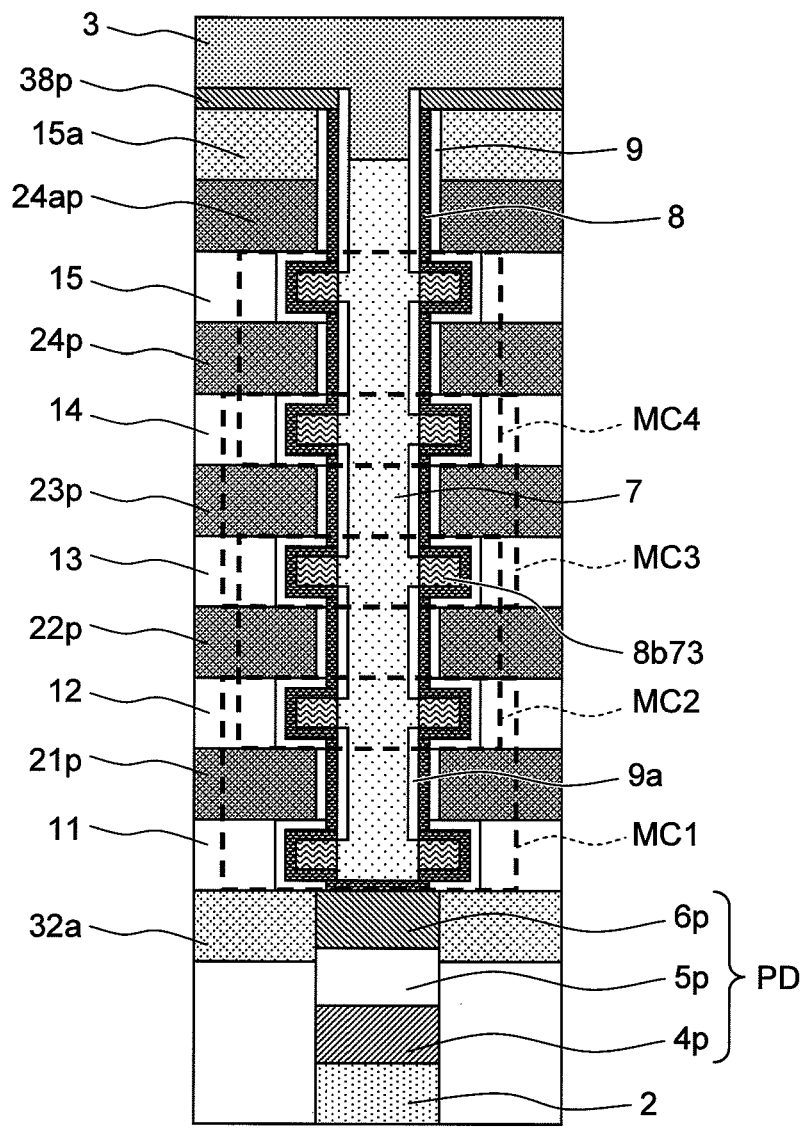
FIG. 18 is a sectional view of phase-change memory as an embodiment of the present invention.
Figure 18:
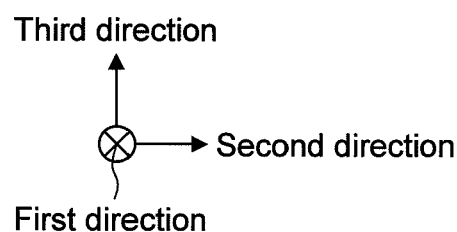

Further, as another embodiment, the sectional views shown in FIGS. 17 and 18 of a key part of a memory cell array are conceivable. In the present embodiment, an insulator film 9a is partially disposed on the inner side of the channel layer 8 (between the channel layer 8 and the phase-change material layer 7) as an addition to the embodiment described with reference to FIGS. 15 and 16. Specifically, the insulator film 9a is disposed along the channel layer 8 that is between the respective adhesion layers 8b73 disposed in the recessed parts formed at the heights of the respective inter-layer insulator films. Accordingly, in the present embodiment, unlike the embodiment described with reference to FIG. 15 and FIG. 16, the channel layer 8 and the phase-change material layer 7 are not in direct contact with each other. Here, the material of the insulator film 9a comprises, by way of example, silicon oxide, silicon nitride, or silicon oxynitride. As previously discussed, the insulator film 9a formed on the inner side of the gate polysilicon layer 21p is separated, in the third direction, from the insulator film 9a formed on the inner side of the gate polysilicon layer 22p. Since, in the present embodiment, the channel layer 8 and the phase-change material layer 7 are not in direct contact with each other, it becomes possible to improve the reliability of the select element as compared to the embodiment described with reference to FIGS. 15 and 16.

The invention by the present inventors has been described in detail above based on embodiments. However, the present invention is by no means limited to the embodiments provided above, and various modifications may of course be made within a scope that does not depart from the spirit thereof.

The embodiments above have been described in the context of phase-change memory that uses a chalcogenide material for the storage elements. However, the material of the storage elements is not limited in any way, and application is not limited to phase-change memory, and may also include various types of semiconductor memory whose electrical properties may be varied by passing a current through an element, examples of which include resistive random-access memory (ReRAM) and other resistive memory, etc.

In addition, the embodiments above have been described with the assumption that polysilicon is used for the gate polysilicon layers that perform gate operations, the channel silicon films that serve as source/drain channels, etc. However, the material of the gate polysilicon layers and channel silicon films is not limited in any way, and the present invention may be realized by employing a conductor, such as a semiconductor material capable of performing gate operations, etc.

Further, in the embodiments above, although such terms as "word line" and "bit line" have been used for ease of comprehension, since they are both select lines used to select a single vertical chain memory, the positional relationship, etc., between word lines and bit lines may be inverted vertically.

A non-volatile memory device of the present invention may be used widely for non-volatile memory devices comprising a variable resistance element formed adjacent to a channel of a select transistor.

LIST OF REFERENCE NUMERALS

2 Word line
3 Bit line
4p-6p Polysilicon layer
7 Phase-change material layer
8 Channel silicon film
8a Channel silicon film
8b Channel silicon film
8b7, 8b7a, 8b72, 8b73 Adhesion layer
9 Gate insulator film
9a Insulator film
11-15, 32 Inter-layer insulator film
15a, 32a Inter-layer insulator film 21p-24p Gate polysilicon layer
38p Polysilicon layer
51 I/O interface
52 Memory cell array
53-56 Power source
57 Voltage selector
58 Line selector
59 Controller
60 Readout system
BL1-BL4 Bit line
BLC Contact plug
F Minimum feature size
GC1-GC4 Contact plug
GL1-GL4 Gate signal line
GLC1 Contact plug
MA Memory cell array
MC1-MC4 Memory cell
PCD1 Phase-change material layer
PD Polysilicon diode
STR1 Select transistor
WL1-WL3 Word line
WLC Contact plug

What is claimed is:

1. A non-volatile memory device comprising:
a substrate;
a first line extending in a first direction, the first direction being parallel to a main surface of the substrate;
a stack comprising N+1 layers (where N≥1) of first insulator films and N layers of first semiconductor layers, the first insulator films and the first semiconductor layers being alternately stacked above the first line;
a second line formed above the stack and extending in a second direction, the second direction being parallel to the main surface of the substrate and orthogonal to the first direction;
a select element provided at a point where the first line and the second line intersect;
a second insulator film provided along a side surface of the stack;
a channel layer provided along the second insulator film;
an adhesion layer provided along the channel layer; and
a variable resistance material layer provided along the channel layer with the adhesion layer in-between, wherein
the first line and the second line are electrically connected with each other via the select element and the channel layer, and
a contact resistance via the adhesion layer between the channel layer and the variable resistance material layer is low, and a resistance of the adhesion layer in a direction in which the channel layer extends is high.

2. The non-volatile memory device according to claim 1, wherein the adhesion layer comprises a film that is discontinuous with respect to the direction in which the channel layer extends.

3. The non-volatile memory device according to claim 1, wherein the adhesion layer comprises a metal comprising Ti, Cr, Co, Ni, or W, or a compound thereof.

4. The non-volatile memory device according to claim 1, wherein the adhesion layer comprises a silicon dot.

5. The non-volatile memory device according to claim 4, wherein the silicon dot is doped with an impurity.

6. The non-volatile memory device according to claim 1, wherein the adhesion layer is provided only at a height range of the first insulator film with respect to the direction in which the channel layer extends.

7. A non-volatile memory device comprising:
a substrate;
a first line extending in a first direction, the first direction being parallel to a main surface of the substrate;
a stack comprising N+1 layers (where N≥1) of first insulator films and N layers of first semiconductor layers, the first insulator films and the first semiconductor layers being alternately stacked above the first line, side surfaces of the first insulator films, which form a portion of a side surface of the stack, being formed so as to be one step recessed relative to side surfaces of the first semiconductor layers;
a second line formed above the stack and extending in a second direction, the second direction being parallel to the main surface of the substrate and orthogonal to the first direction;
a select element provided at a point where the first line and the second line intersect;
a second insulator film provided along the side surface of the stack;
a channel layer provided along the second insulator film;
an adhesion layer provided only at the same height ranges as the side surfaces of the first insulator films with respect to a direction in which the channel layer extends; and
a variable resistance material layer provided along side surfaces of the channel layer and the adhesion layer, wherein
the first line and the second line are electrically connected with each other via the select element and the channel layer, and
a contact resistance via the adhesion layer between the channel layer and the variable resistance material layer is low, and a resistance of the adhesion layer in the direction in which the channel layer extends is high.

8. The non-volatile memory device according to claim 7, further comprising third insulator films respectively provided on both an upper surface side and a lower surface side of the stack, wherein
an etching rate of the third insulator films is lower than an etching rate of the first insulator films.

9. The non-volatile memory device according to claim 8, wherein
the first insulator films comprise silicon oxide, and
the third insulator films comprise silicon nitride or silicon oxynitride.

10. The non-volatile memory device according to claim 7, wherein a fourth insulator film is provided between the channel layer and the variable resistance material layer excluding the ranges where the adhesion layer is provided.

11. The non-volatile memory device according to claim 7, wherein the adhesion layer comprises a metal comprising Ti, Cr, Co, Ni, or W, or a compound thereof.

12. The non-volatile memory device according to claim 7, wherein the adhesion layer comprises a silicon dot.

13. The non-volatile memory device according to claim 12, wherein the silicon dot is doped with an impurity.

* * * * *